United States Patent
Hendrikx et al.

(10) Patent No.: US 11,635,694 B2
(45) Date of Patent: Apr. 25, 2023

(54) METHOD FOR MAKING A LITHOGRAPHIC PRINTING PLATE

(71) Applicant: AGFA OFFSET BV, Mortsel (BE)

(72) Inventors: Peter Hendrikx, Mortsel (BE); Katleen Himschoot, Mortsel (BE); Sam Verbrugghe, Mortsel (BE)

(73) Assignee: AGFA Offset BV, Mortsel (BE)

( * ) Notice: Subject to any disclaimer, the term of this patent is extended or adjusted under 35 U.S.C. 154(b) by 221 days.

(21) Appl. No.: 16/768,743

(22) PCT Filed: Nov. 30, 2018

(86) PCT No.: PCT/EP2018/083098
§ 371 (c)(1),
(2) Date: Jun. 1, 2020

(87) PCT Pub. No.: WO2019/110432
PCT Pub. Date: Jun. 13, 2019

(65) Prior Publication Data
US 2021/0173308 A1  Jun. 10, 2021

(30) Foreign Application Priority Data
Dec. 8, 2017  (EP) ..................................... 17206098

(51) Int. Cl.
G03F 7/20  (2006.01)
G03F 7/40  (2006.01)
(52) U.S. Cl.
CPC .............. *G03F 7/2024* (2013.01); *G03F 7/40* (2013.01)

(58) Field of Classification Search
CPC .................................. G03F 7/2024; G03F 7/40
See application file for complete search history.

(56) References Cited

U.S. PATENT DOCUMENTS

| | | | |
|---|---|---|---|
| 4,326,018 A | 4/1982 | Jargiello | |
| 4,555,302 A * | 11/1985 | Urbanik | G03F 7/3014 134/198 |
| 9,751,295 B2 * | 9/2017 | Lingier | B41C 1/1066 |
| 9,962,923 B2 * | 5/2018 | Hendrikx | G03F 7/105 |
| 10,151,975 B2 * | 12/2018 | Steenackers | C07C 233/18 |
| 2003/0118944 A1 | 6/2003 | Copeland et al. | |
| 2009/0317601 A1 | 12/2009 | Gerard et al. | |
| 2011/0053085 A1 | 3/2011 | Huang et al. | |
| 2012/0137908 A1* | 6/2012 | Teng | G03F 7/38 101/463.1 |
| 2013/0242276 A1 | 9/2013 | Schadebrodt et al. | |

FOREIGN PATENT DOCUMENTS

| | | |
|---|---|---|
| DE | 2 201 936 A1 | 7/1973 |
| DE | 26 48 438 B1 | 1/1978 |
| EP | 1 506 854 A1 | 2/2005 |

(Continued)

OTHER PUBLICATIONS

Official Communication issued in International Patent Application No. PCT/EP2018/083098, dated Feb. 22, 2019.

*Primary Examiner* — Hung V Nguyen
(74) *Attorney, Agent, or Firm* — Leydig, Voit & Mayer, Ltd.

(57) ABSTRACT

A method for making a negative-working lithographic printing plate includes subjecting an image-wise exposed, developed, and dried plate precursor to UV LED radiation.

18 Claims, 1 Drawing Sheet

(56) References Cited

FOREIGN PATENT DOCUMENTS

| EP | 1 788 441 A1 | 5/2007 |
|----|--------------|--------|
| EP | 1 865 382 A1 | 12/2007 |
| GB | 1413 374 A | 11/1975 |
| GB | 2 205 419 A | 12/1988 |
| WO | 2015/055409 A1 | 4/2015 |

* cited by examiner

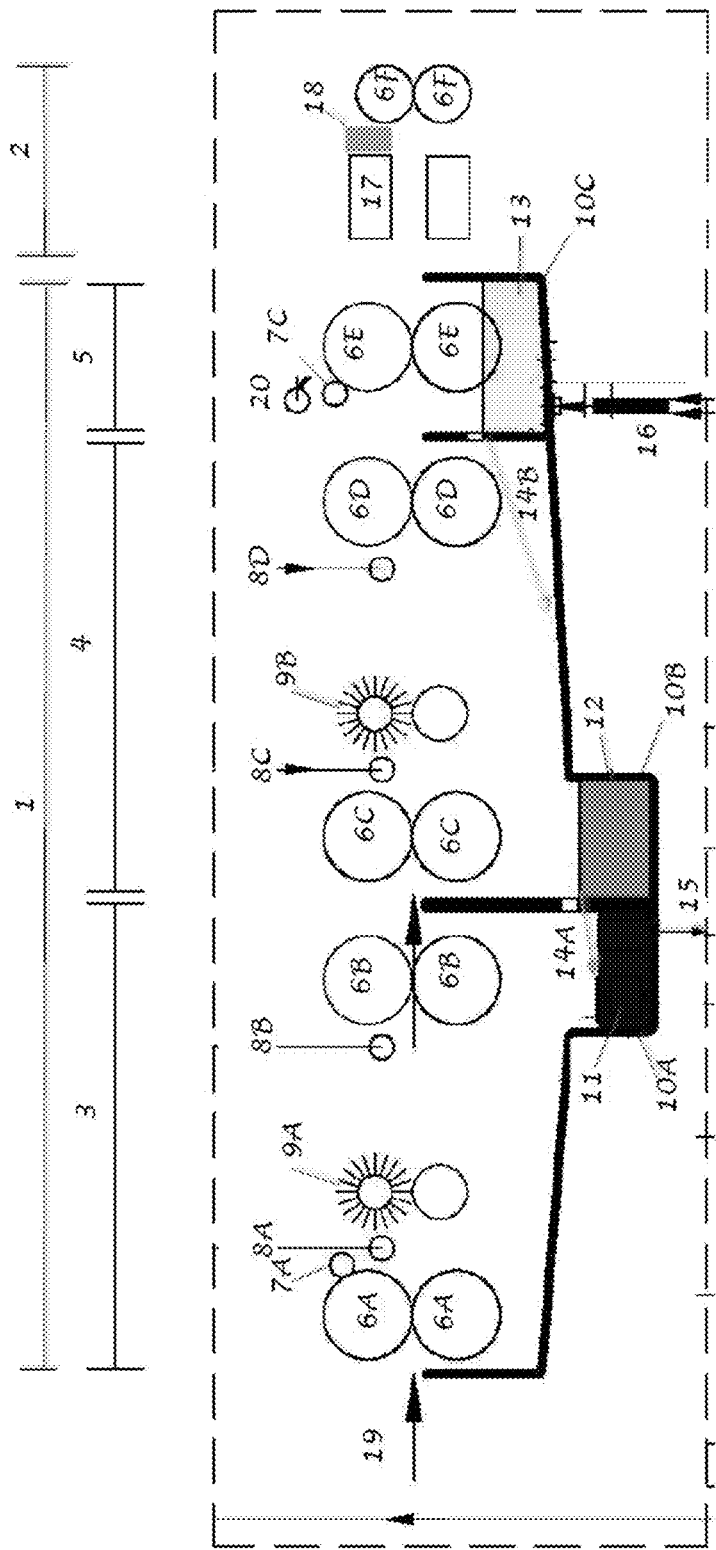

METHOD FOR MAKING A LITHOGRAPHIC PRINTING PLATE

CROSS REFERENCE TO RELATED APPLICATIONS

This application is a 371 National Stage Application of PCT/EP2018/083098, filed Nov. 30, 2018. This application claims the benefit of European Application No. 17206098.0, filed Dec. 8, 2017, which is incorporated by reference herein in its entirety.

BACKGROUND OF THE INVENTION

1. Field of the Invention

The invention relates to a novel method for making a lithographic printing plate.

2. Description of the Related Art

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Lithographic printing masters are generally obtained by the image-wise exposure and processing of a radiation sensitive layer on a lithographic support. Imaging and processing renders the so-called lithographic printing plate precursor into a printing plate or master. Image-wise exposure of the radiation sensitive coating to heat or light, typically by means of a digitally modulated exposure device such as a laser, triggers a (physico-)chemical process, such as ablation, polymerization, insolubilization by crosslinking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular lithographic plate precursors require wet processing since the exposure produces a difference in solubility or difference in rate of dissolution in a developer between the exposed and the non-exposed areas of the coating. In positive working lithographic plate precursors, the exposed areas of the coating dissolve in the developer while the non-exposed areas remain resistant to the developer. In negative working lithographic plate precursors, the non-exposed areas of the coating dissolve in the developer while the exposed areas remain resistant to the developer. Most lithographic plate precursors contain a hydrophobic coating on a hydrophilic support, so that the areas which remain resistant to the developer define the ink-accepting, hence printing areas of the plate while the hydrophilic support is revealed by the dissolution of the coating in the developer at the non-printing areas.

Photopolymer printing plates rely on a working-mechanism whereby the coating—which typically includes free radically polymerisable compounds—hardens upon exposure. "Hardens" means that the coating becomes insoluble or non-dispersible in the developing solution and may be achieved through polymerization and/or crosslinking of the photosensitive coating upon exposure to light. Photopolymer plate precursors can be sensitized to blue, green or red light i.e. wavelengths ranging between 450 and 750 nm, to violet light i.e. wavelengths ranging between 350 and 450 nm or to infrared light i.e. wavelengths ranging between 750 and 1500 nm. Optionally, the exposure step is followed by a heating step to enhance or to speed-up the polymerization and/or crosslinking reaction.

In general, a top layer or protective overcoat layer over the imageable layer is required to act as an oxygen barrier to provide the desired sensitivity to the plate. A top layer typically includes water-soluble or water-swellable polymers such as for example polyvinylalcohol. Besides acting as barrier for oxygen, the top layer should best be easily removable during processing and be sufficiently transparent for actinic radiation, e.g. from 300 to 450 nm or from 450 to 750 nm or from 750 to 1500 nm.

The classical workflow of photopolymer plates involves first an exposure step of the photopolymer printing plate precursor in a violet or infrared platesetter, a wash step of the protective overcoat layer, an alkaline developing step, and a rinse and gum step. Over the past years, there is a clear evolution in the direction of a simplified workflow where the washing, developing, rinse and/or gumming steps are carried out in one single step or where processing is carried out with a neutral gum and then gummed in a second step. Alternatively, on-press processing wherein the plate is mounted on the press and the coating layer is developed by interaction with the fountain and ink that are supplied to the plate during the press run, has become very popular. During the first runs of the press, the non-image areas are removed from the support and thereby define the non-printing areas of the plate.

Optionally, the exposure step is followed by a heating step to enhance or to speed-up the polymerization and/or crosslinking reaction, and/or to improve the adhesion of the image parts to the substrate. This heating step is believed to selectively crosslink those regions of the coating that were selectively imaged during the exposure step, rendering them preferentially less soluble in a developer. As a result, the robustness on the press of the plates—i.e. the press life—is significantly improved.

This overall heating step after imaging and before development is typically referred to in the art as a "preheat step". With the objective of eliminating this both energy and time consuming preheat step, preheat-free photopolymer plates have been disclosed in the art. Such preheat-free photopolymer plates typically contain a softer (i.e. low Tg) photolayer combined with an adhesion promotor to reach both a high degree of polymerization and at the same time a good adhesion to the substrate. However, even though such preheat-free photopolymer plates are used today and are commercialized especially in IR imageable (thermal) photopolymer plates, they still lack the robustness of a preheat-required photopolymer plate. A typical heating step, involves heating at a temperature of about 80° C. to 150° C. during a dwell time of about 5 seconds to 1 minute. In practice, a preheat oven requires a long stabilization time and is therefore preferably non-stop operational resulting in a high energy consumption.

The press life of photopolymer plates can also be improved by heating the image formed on the support after the development and/or gumming step—also referred to as "baking" or "post-baking". Typically, this post-baking step is carried out by heating the plate in a large heating oven at a temperature of about 235° C. to 290° C. during a relatively long time of about 2 to 5 minutes, even up to 10 minutes. This process can substantially extend the life of the plate on the press.

However, this time consuming baking process is unfavourable as it significantly slows down the throughput of printing plate precursors during their production, and in view of the high energy consumption, such a baking step is unfavourable from both an ecological and economical point of view. A further disadvantage is that such large ovens take a lot of space. In addition, the heat produced during such a baking step is often excessive and/or unevenly distributed resulting in a wavy plate which is difficult to accurately mount onto the press. Also, to prevent background contamination during the post-baking step, often a protective gum is applied to the plate i.e. a baking gum, which needs to be removed after baking and replaced by a plate finisher. These actions are both time consuming and labor intensive making the production process of the printing plates less efficient.

GB 2 205 419 discloses a heat treatment of processed printing plates by means of infrared radiation whereby the solvent resistance of the plate is improved. The method allows for heating combined with development in a single automatic processing machine so that a separate baking machine is unnecessary.

US 2009/0317601 discloses a method for improving the durability of a printing plate which involves a post-development treatment with infrared radiation having a wavelength of about 780 nm to 1400 nm.

A method for fixing the printing areas of a metallic offset-printing plate by heating with infrared radiation after image-wise exposing and processing, is disclosed in DE 26 48 438 and DE 2 201 936.

WO2015/055409 discloses a method for making a lithographic printing plate including a colorant in its coating comprising the step of subjecting the plate to heat or radiation after the drying step whereby a colour change in the printing areas is induced.

U.S. Pat. No. 4,326,018 discloses post-curing of a diazobased printing plate by air-baking at high temperatures for 5 to 30 minutes or by exposure with a UV or mercury vapour lamp having 50 to 200 Watt for a period of 10 s to 2 minutes.

EP 1 506 854 discloses a method for making a lithographic printing plate comprising a baking step which is carried out within a dwell-time of less than 1 minute and wherein the chemical resistance of the coating against printing liquids and press chemicals is improved. The baking step is carried out by exposing the printing plate to an infrared radiation source, preferably in a dynamic configuration.

US 2003/0118944 discloses a method for improving the durability of a negative-working, light sensitive lithographic printing plate including, after an imaging and development step, a further exposing step to electromagnetic radiation comprising a wavelength not greater than about 300 nanometers. This exposing step promotes further addition polymerization and/or crosslinking reactions of the light sensitive coating.

In the art, there is still an urgent need for methods for making photopolymer printing plates, which preferably do not involve a preheat step and which offer an improved press life whereby the cost (energy consumption) and/or intensive labor associated with the post-baking methods of the prior art, are eliminated or at least reduced.

SUMMARY OF THE INVENTION

It is an object of the present invention to provide an improved method for preparing high quality, negative-working, violet sensitive lithographic printing plates based on photopolymerisation and/or crosslinking, preferably preheat free, having an excellent press life.

This object is achieved by the method as defined below. The method has the specific feature that the violet sensitive printing plate precursor is post treated after image exposing, development and drying and/or heating, with UV radiation, more specific with light emitting diode(s) (LED) emitting UV-A radiation, also referred to herein as "UV LED radiation".

It was surprisingly found that said post treating step conducted on a plate still having an elevated temperature due to the drying and/or heating step, results in an excellent press life, or in other words, it was surprisingly found that the heat applied in e.g. the drying step reinforces the effect of said post treatment with UV LED radiation. Without being bound to any theoretical explanation, it is believed that such a post treatment renders the image parts to harden to nearly completion whereby a plate having an excellent press life is obtained without the need for a time and energy consuming post baking step and/or preheat step.

According to the present invention, there is also provided an apparatus which is designed to perform this post treatment. More specific, it is also an aspect of the present invention to provide a processing apparatus which is designed for performing the UV LED radiation of the present invention. A preferred embodiment of this apparatus of the present invention is described in more detail below (see FIG. 1).

Other features, elements, steps, characteristics and advantages of the present invention will become more apparent from the following detailed description of preferred embodiments of the present invention. Specific embodiments of the invention are also defined below.

BRIEF DESCRIPTION OF THE DRAWINGS

The FIGURE is a schematic representation of a preferred embodiment of the processing apparatus of the invention shown as it is filled with gum solution.

The numbers in the FIGURE refer to the following features of a preferred apparatus according to the present invention:
- 1 developing/gumming section
- 2 drying section
- 3 first gumming unit
- 4 second gumming unit
- 5 third gumming unit
- 6 roller pairs: 6A, 6B, 6C, 6D and 6E (gumming section); and 6F (drying section)
- 7 scavenger rollers 7A and 7C
- 8 spray bars 8A, 8B, 8C, 8D and 8E
- 9 brushes 9A and 9B
- 10 first gum sump 10A, second gum sump 10B and third gum sump 10C
- 11 first development/gum solution
- 12 second development/gum solution
- 13 third development/gum solution
- 14 14A second cascade overflow and 14B first cascade overflow 15 drain
16 gum feed
17 drying means
18 UV LED bar
19 processing direction
20 gum application nozzle

DETAILED DESCRIPTION OF THE PREFERRED EMBODIMENTS

According to the present invention there is provided a method for making a negative-working, violet sensitive lithographic printing plate comprising the steps of imagewise exposing a printing plate precursor followed by developing the imagewise exposed precursor so that the non-exposed areas are dissolved in the developer solution, drying and/or heating the exposed precursor and finally post treating the obtained plate with UV LED radiation. Optionally, after the imaging step, a heating step—i.e. a preheat—is carried out to enhance or to speed-up the polymerization and/or crosslinking reaction. However, in the method of the current invention, there is preferably no preheat step.

The lithographic printing plate precursor can be prepared by applying on a support the coating as described below and drying the precursor.

The Printing Plate Precursor

The lithographic printing plate precursor used in the present invention comprises a support having a hydrophilic surface or which is provided with a hydrophilic layer, and a coating including a photopolymerisable and/or crosslinkable layer. The precursor is negative-working, i.e. after exposure and development the non-exposed areas of the coating are removed from the support and define hydrophilic (non-printing) areas, whereas the exposed coating is not removed from the support and defines oleophilic (printing) areas. The hydrophilic areas are defined by the support which has a hydrophilic surface or is provided with a hydrophilic layer. The hydrophobic areas are defined by the coating, hardened upon exposing, optionally followed by a heating step. Areas having hydrophilic properties means areas having a higher affinity for an aqueous solution than for an oleophilic ink; areas having hydrophobic properties means areas having a higher affinity for an oleophilic ink than for an aqueous solution.

"Hardened" means that the coating becomes insoluble or non-dispersible for the developing solution and may be achieved through polymerization and/or crosslinking of the photosensitive coating.

The coating has at least one layer including a photopolymerisable and/or crosslinkable composition. The layer including the mainly photopolymerisable composition is also referred to as the "photopolymerisable layer", the layer including the mainly crosslinkable composition is also referred to as the "crosslinkable layer". The coating may include an intermediate layer, located between the support and the photopolymerisable and/or crosslinkable layer.

The Photopolymerisable Layer

The photopolymerisable layer includes a polymerisable compound, optionally a binder, a polymerization initiator capable of hardening said polymerisable compound in the exposed areas, and optionally a sensitizer capable of absorbing light used in the image-wise exposing step. The photopolymerizable layer has a coating thickness preferably ranging between 0.2 and 5.0 g/m$^2$, more preferably between 0.4 and 3.0 g/m$^2$, most preferably between 0.6 and 2.2 g/m$^2$.

Polymerisable Compound and Initiator

The polymerisable compound is preferably a monomer or oligomer including at least one epoxy or vinyl ether functional group and the polymerisation initiator is a Brönsted acid generator capable of generating free acid, optionally in the presence of a sensitizer, upon exposure, hereinafter the Brönsted acid generator is also referred to as "cationic photoinitiator" or "cationic initiator".

Suitable polyfunctional epoxy monomers include, for example, 3,4-epoxycyclohexylmethyl-3,4-epoxycyclohexane carboxylate, bis-(3,4-epoxycyclohexymethyl) adipate, difunctional bisphenol A-epichlorohydrin epoxy resin and multifunctional epichlorohydrintetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Brönsted acid, they also generate free radicals during photo or thermal decomposition.

According to a more preferred embodiment of the present invention, the further polymerisable compound is a polymerisable monomer or oligomer including at least one terminal ethylenic group, hereinafter also referred to as "free-radical polymerisable monomer", and the polymerisation initiator is a compound capable of generating free radicals upon exposure, optionally in the presence of a sensitizer, hereinafter said initiator is referred to as "free radical initiator". The polymerisation involves the linking together of the free-radical polymerisable monomers.

Suitable free-radical polymerisable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have other double bond or epoxide group, in addition to (meth)acrylate group. The (meth)acrylate monomers may also contain an acidic (such as carboxylic acid) or basic (such as amine) functionality.

Suitable free-radical polymerisable monomers are disclosed in [0042] and [0050] of EP 2 916 171 and are incorporated herein by reference.

The coating contains a free radical initiator capable of generating free radicals upon exposure directly and/or in the presence of a sensitizer. Suitable free-radical initiators are described in WO 2005/111727 from page 15 line 17 to page 16 line 11 and EP 1 091 247 and may include for example hexaaryl-bisimidazole compound (HABI; dimer of triarylimidazole), aromatic ketones, aromatic onium salts, organic peroxides, thio compounds, ketooxime ester compounds, borate compounds, azinium compounds, metallocene compounds, active ester compounds and further compounds having a carbon-halogen bond.

The photopolymerisable layer may also comprise a co-initiator. Typically, a co-initiator is used in combination with a free radical initiator. Suitable co-initiators for use in the photopolymer coating are disclosed in U.S. Pat. Nos. 6,410, 205; 5,049,479; EP 1 079 276, EP 1 369 232, EP 1 369 231, EP 1 341 040, US 2003/0124460, EP 1 241 002, EP 1 288 720 and in the reference book including the cited refences: Chemistry & Technology UV & EB formulation for coatings, inks & paints—Volume 3-Photoinitiators for Free Radical and Cationic Polymerisation by K. K. Dietliker— Edited by P.K.T. Oldring—1991—ISBN 0 947798161. Specific co-initiators, as described in EP 107 792, may be present in the photopolymerizable layer to further increase the sensitivity. Preferred co-initiators are disclosed in EP 2 916 171 [0051] and are incorporated herein by reference.

Sensitizer

A very high sensitivity can be obtained by including a sensitizer such as for example an optical brightener in the coating. Suitable examples of optical brighteners as sensitizers are described in WO 2005/109103 page 24, line 20 to page 39. Other preferred sensitizers are blue, green or red light absorbing sensitizers, having an absorption spectrum between 450 nm and 750 nm. Useful sensitizers can be selected from the sensitizing dyes disclosed in U.S. Pat. Nos. 6,410,205; 5,049,479; EP 1 079 276, EP 1 369 232, EP 1 369 231, EP 1 341 040, US 2003/0124460, EP 1 241 002 and EP 1 288 720.

The Binder

The photopolymerizable layer preferably includes a binder. The binder can be selected from a wide series of organic polymers. Compositions of different binders can also be used. Useful binders are described in WO2005/111727 page 17 line 21 to page 19 line 30, EP 1 043 627 in paragraph [0013] and in WO2005/029187 page 16 line 26 to page 18 line 11.

Further Ingredients

The photopolymerisable layer may also comprise particles which increase the resistance of the coating against manual or mechanical damage. The particles may be inorganic particles, organic particles or fillers such as described in for example U.S. Pat. No. 7,108,956. More details of suitable spacer particles described in EP 2 916 171 [0053] to [0056] are incorporated herein by reference.

The photopolymerizable layer may also comprise an inhibitor. Particular inhibitors for use in the photopolymer coating are disclosed in U.S. Pat. No. 6,410,205, EP 1 288 720 and EP 1 749 240.

The photopolymerizable layer may further comprise an adhesion promoting compound. The adhesion promoting compound is a compound capable of interacting with the support, preferably a compound having an addition-polymerizable ethylenically unsaturated bond and a functional group capable of interacting with the support. Under "interacting" is understood each type of physical and/or chemical reaction or process whereby, between the functional group and the support, a bond is formed which can be a covalent bond, an ionic bond, a complex bond, a coordinate bond or a hydrogen-bond, and which can be formed by an adsorption process, a chemical reaction, an acid-base reaction, a complex-forming reaction or a reaction of a chelating group or a ligand.

The adhesion promoting compound may be selected from at least one of the low molecular weight compounds or polymeric compounds as described in EPA 851 299 from lines 22 on page 3 to line 1 on page 4, EP-A 1 500 498 from paragraph [0023] on page 7 to paragraph [0052] on page 20, EP-A 1 495 866 paragraph [0030] on page 5 to paragraph [0049] on page 11, EP-A 1 091 251 from paragraph [0014] on page 3 to paragraph [0018] on page 20, and EP-A 1 520 694 from paragraph [0023] on page 6 to paragraph [0060] on page 19. Preferred compounds are those compounds which comprise a phosphate or phosphonate group as functional group capable of adsorbing on the aluminium support and which comprise an addition-polymerizable ethylenic double bond reactive group, especially those described in EP-A 851 299 from lines 22 on page 3 to line 1 on page 4 and EP-A 1 500 498 from paragraph [0023] on page 7 to paragraph [0052] on page 20. Also preferred are those compounds which comprises a tri-alkyl-oxy silane groups, hereinafter also referred to as "trialkoxy silane" groups, wherein the alkyl is preferably methyl or ethyl, or wherein the trialkyloxy silane groups are at least partially hydrolysed to silanol groups, as functional group capable of adsorbing on the support, especially silane coupling agents having an addition-polymerizable ethylenic double bond reactive group as described in EP-A 1 557 262 paragraph [0279] on page 49 and EP-A 1 495 866 paragraph [0030] on page 5 to paragraph [0049] on page 11. Also the adhesion promoting compounds described in EP 2 916 171 [0058] are incorporated herein by reference.

The adhesion promoting compound may be present in the photopolymerizable layer in an amount ranging between 1 and 50 wt %, preferably between 3 and 30 wt %, more preferably between 5 and 20 wt % of the non-volatile components of the composition.

The adhesion promoting compound may be present in an optional intermediate layer in an amount of at least 25 wt %, preferably at least 50 wt %, more preferably at least 75 wt %, of the non-volatile components of the composition. Alternatively, the intermediate layer may consist of the adhesion promoting compound.

Various surfactants may be added into the photopolymerisable layer to allow or enhance the developability of the precursor; especially developing with a gum solution. Both polymeric and small molecule surfactants for example non-ionic surfactants are preferred. More details are described in EP 2 916 171 [0059] and are incorporated herein by reference.

The Crosslinkable Layer

The crosslinkable layer may include a diazonium compound and preferably a binder.

Diazonium compounds are preferably characterized by the generic structure A—$N_2^+X^-$, wherein A is an aromatic or heterocyclic residue and X is the anion of an acid. Specific examples of light sensitive diazonium coatings include higher molecular weight compositions obtained, for example, by the condensation of certain aromatic diazonium salts in an acid condensation medium with active carbonyl compounds such as formaldehyde, as disclosed for example in U.S. Pat. Nos. 2,063,631 and 2,667,415. Suitable examples include condensation products of diazonium salts of p-amino-diphenylamines, such as diphenylamine-4-diazonium chloride or diphenylamine-4-diazonium bromide or diphenyl-arnine-4-diazonium phosphate, with formaldehyde in phosphoric acid of high concentration. The term phosphoric acid also includes pyrophosphoric acid, metaphosphoric acid, and poly-phosphoric acid.

Another preferred class of diazonium compounds is described in U.S. Pat. No. 3,849,392. The compounds are the polycondensation product of 3-methoxy-4-diazo-diphenyl amine sulfate and 4,4'-bis-methoxy methyl-diphenyl ether, precipitated as mesitylene sulfonate, as taught in U.S. Pat. No. 3,849,392. The most preferred diazonium salt is benzenediazonium, 2-methoxy-4-(phenylamino)-, 2,4,6-trimethylbenzenesulfonate (1:1), polymer with 1,1'-oxybis [4-(methoxymethyl)benzene]. The preparation of this diazonium salt is disclosed in DE 2024244A. Other diazonium salts disclosed in this document are suitable to be contained in the crosslinkable layer.

The diazonium salt is preferably present in the coating composition in an amount of from about 20% to about 100% by weight of the solid composition components. A more preferred range is from about 25% to 50% and most preferably from about 30% to 45%.

The binder may be added to the diazonium compound to improve mechanical resistance of the crosslinkable layer and/or the processing behaviour of the plate.

Suitable binders are polyvinyl acetates, epoxy resins based on bis-phenol-A-epichlorohydrin, p-(vinyl butyral-co-, vinyl acetate-co-vinyl alcohol), unplasticized urea resin of an approximate acid number of 2 (Resamin 106 F), Recinene-modified alkyd resin, Resins comprising a polyvinyl acetate resin and a styrene/maleic acid half ester copolymer.

Suitable polyvinyl acetate resins have a weight average molecular weight in the range of from about 40.000 to less than 800.000. A preferred weight average molecular weight maximum is about 700.000; more preferably 680.000. The most preferred average molecular weight is in the range of about 80.000 to 200,000. Preferred binders are the butyl semi-ester of the maleic acid anhydride/styrene copolymers (such as Scripset® 540, available from Monsanto) and the styrene/maleic acid half ester copolymers as disclosed in U.S. Pat. No. 4,511,640A. A more preferred binder is obtained by reacting p-[vinylbutyral-co-vinyl alcohol-co-vinyl acetate] such as Mowital B30T or Mowital B60T (from Kuraray Europe GmbH) with maleic acid anhydride to a half-ester and half acid, with the OH of the polyvinylalcohol as disclosed in Preparation Example 5 in U55695905.

The binder is preferably present in the coating composition in an amount of from about 8% to about 60% by weight of the solid composition components. A more preferred range is from about 12% to 50% and most preferably from about 18% to 45%.

The weight ratio of binder to diazonium compound does not exceed 20, preferably equal to or less than 10, more preferably between 0.8 and 1.2.

The coverage of the crosslinkable layer is preferably between 0.1 and 1.2 $g/m^2$, more preferably between 0.5 and 0.8 $g/m^2$.

The crosslinkable layer may further comprise additives, such as for example acid stabilizers including phosphoric, citric, tartaric and p-toluene sulfonic acids. The acid stabilizer may be present in the coating composition in an amount of from about 1.5% to about 4.5% by weight of the solid composition components, a more preferably from about 2.0% to 4.0% and most preferably from about 2.5% to 3.5%.

Exposure indicators including para phenyl azo diphenyl amine, Calcozine Fuchine dyes and Crystal Violet and Methylene Blue dyes may be present in an amount from about 0.05% to about 0.35% by weight of the solid composition components. A more preferred range is from about 0.10% to 0.30% and most preferably from about 0.15% to 0.25%.

Non-limiting examples of colorants which may be present in the coating include dyes such as Acetosol Fire Red 3GLS, Sandolan Eosin E-G, Acetosol Green BLS, Genacryl Blue 3G, Sandolan Cyanine N-6B, Sandoplast Blue R, Atlantic Alizarine Milling Blue FFR 200, Neozapon Fiery Red BL, Erythrosine, Methylene Blue IaD Extra, Victoria Pure Blue FGA; and such pigments as Geen Gold Pigment and Sunfast Violet.

The colorant may be present in the coating composition in an amount from about 0.25% to about 0.55% by weight of the solid composition components, more preferably from about 0.30% to 0.50% and most preferably from about 0.35% to 0.45%.

Suitable solvents which may be used as a medium to combine the ingredients of the coating include Methyl Cellosolve, ethylene glycol ethers, butyrolactone, alcohols as ethyl alcohol and n-propanol, and ketones such as methyl ethyl ketone.

Top Layer

The coating may include on the photopolymerisable layer, a top layer or protective overcoat layer which acts as an oxygen barrier layer including water-soluble or water-swellable binders. Printing plate precursors which do not contain a top layer or protective overcoat layer are also referred to as overcoat-free printing plate precursors. In the art, it is well-known that low molecular weight substances present in the air may deteriorate or even inhibit image formation and therefore usually a top layer is applied to the coating. A top layer should be easily removable during development, adhere sufficiently to the photopolymerisable layer or optional other layers of the coating and should preferably not inhibit the transmission of light during exposure. Preferred binders which can be used in the top layer are polyvinyl alcohol and the polymers disclosed in WO 2005/029190; U.S. Pat. No. 6,410,205 and EP 1 288 720, including the cited references in these patents and patent applications. The most preferred binder for the top layer is polyvinylalcohol. The polyvinylalcohol has preferably a hydrolysis degree ranging between 74 mol % and 99 mol %, more preferably between 88-98%. The weight average molecular weight of the polyvinylalcohol can be measured by the viscosity of an aqueous solution, 4% by weight, at 20° C. as defined in DIN 53 015, and this viscosity number ranges preferably between 2 and 26, more preferably between 2 and 15, most preferably between 2 and 10.

The overcoat layer may optionally include other ingredients such as inorganic or organic acids, matting agents or wetting agents as disclosed in EP 2 916 171 and are incorporated herein by reference.

The coating thickness of the optional top layer is preferably between 0.25 and 1.75 $g/m^2$, more preferably between 0.25 and 1.3 $g/m^2$, most preferably between 0.25 and 1.0 $g/m^2$. In a more preferred embodiment of the present invention, the optional top layer has a coating thickness between 0.25 and 1.75 $g/m^2$ and comprises a polyvinylalcohol having a hydrolysis degree ranging between 74 mol % and 99 mol % and a viscosity number as defined above ranging between 2 and 26.

Support

The lithographic printing plate used in the present invention comprises a support which has a hydrophilic surface or which is provided with a hydrophilic layer. The support is preferably a grained and anodized aluminium support, well-known in the art. Suitable supports are for example disclosed in EP 1 843 203 (paragraphs [0066] to [0075]). The surface roughness, obtained after the graining step, is often expressed as arithmetical mean center-line roughness Ra (ISO 4287/1 or DIN 4762) and may vary between 0.05 and 1.5 µm. The aluminum substrate of the current invention has preferably an Ra value below 0.45 µm, more preferably below 0.40 µm and most preferably below 0.30 µm. The lower limit of the Ra value is preferably about 0.1 µm. More details concerning the preferred Ra values of the surface of the grained and anodized aluminum support are described in EP 1 356 926. By anodising the aluminum support, an $Al_2O_3$ layer is formed and the anodic weight (g/$m^2$ $Al_2O_3$ formed on the aluminum surface) varies between 1 and 8 g/$m^2$. The anodic weight is preferably 3 g/$m^2$, more preferably 3.5 g/$m^2$ and most preferably 4.0 g/$m^2$.

The grained and anodized aluminium support may be subjected to so-called post-anodic treatments, for example a treatment with polyvinylphosphonic acid or derivatives thereof, a treatment with polyacrylic acid, a treatment with potassium fluorozirconate or a phosphate, a treatment with an alkali metal silicate, or combinations thereof. Alternatively, the support may be treated with an adhesion promoting compound such as those described in EP 1 788 434 in [0010] and in WO 2013/182328. However, for a precursor optimized to be used without a preheat step it is preferred to use a grained and anodized aluminium support without any post-anodic treatment.

Besides an aluminium support, a plastic support, for example a polyester support, provided with one or more hydrophilic layers as disclosed in for example EP 1 025 992 may also be used.

Exposure Step

Preferably, the printing plate precursor is image-wise exposed off-press in a platesetter, i.e. an exposure apparatus suitable for image-wise exposing the precursor with a laser such as a laser diode or by a conventional exposure in contact with a mask. Imaging is preferably carried out using a source of UV radiation or "violet" imaging or exposing radiation at a wavelength of from at least 150 nm and up to and including 475 nm, typically at a wavelength of from 200 nm and up to and including 450 nm and more typically at a wavelength of from 350 nm and up to and including 410 nm. The printing plate precursor is preferably image-wise exposed by a laser emitting UV-light.

Preheat Step

After the exposing step, the precursor may optionally be preheated in a preheating unit, preferably at a temperature of about 80° C. to 150° C. and preferably during a dwell time of about 5 seconds to 1 minute. This preheating unit may comprise a heating element, preferably an IR-lamp, hot air system (heated air) or a heated roll. Such a preheat step can be used to enhance or speed-up the polymerization and/or crosslinking reaction of the photopolymerisable composition of the printing plate precursor.

In a highly preferred embodiment, the plate is not subjected to a preheat step between the image-wise exposing step and developing step.

Development Step

Subsequently to the exposing step or the preheat step, when a preheat step is present, the photopolymerisable plate precursor may be processed (developed). Before developing the imaged precursor, a pre-wash step might be carried out especially for the negative-working lithographic printing precursors having a protective oxygen barrier or topcoat. This pre-wash step can be carried out in a stand-alone apparatus or by manually rinsing the imaged precursor with water or the pre-wash step can be carried out in a washing unit that is integrated in a processor used for developing the imaged precursor. The washing liquid is preferably water, more preferably tap water. More details concerning the wash step are described in EP 1 788 434 in [0026].

During the development step, the non-exposed areas of the image-recording layer are at least partially removed without essentially removing the exposed areas. The processing liquid, also referred to as developer, can be applied to the plate e.g. by rubbing with an impregnated pad, by dipping, immersing, coating, spincoating, spraying, pouring-on, either by hand or in an automatic processing apparatus. The treatment with a processing liquid may be combined with mechanical rubbing, e.g. by a rotating brush. During the development step, any water-soluble protective layer present is preferably also removed. The development is preferably carried out at temperatures between 20 and 40° C. in automated processing units.

In a highly preferred embodiment, the processing step as described above is replaced by an on-press processing whereby the imaged precursor is mounted on a press and processed on-press by rotating said plate cylinder while feeding dampening liquid and/or ink to the coating of the precursor to remove the unexposed areas from the support. In a preferred embodiment, only dampening liquid is supplied to the plate during start-up of the press. After a number of revolutions of the plate cylinder, preferably less than 50 and most preferably less than 5 revolutions, also the ink supply is switched on. In an alternative embodiment, supply of dampening liquid and ink can be started simultaneously or only ink can be supplied during a number of revolutions before switching on the supply of dampening liquid.

The processing step may also be performed by combining embodiments described above, e.g. combining development with a processing liquid with development on-press by applying ink and/or fountain.

Processing Liquid

The processing liquid may be an alkaline developer or solvent-based developer. Suitable alkaline developers have been described in US2005/0162505. An alkaline developer is an aqueous solution which has a pH of at least 11, more typically at least 12, preferably from 12 to 14. Alkaline developers typically contain alkaline agents to obtain high pH values can be inorganic or organic alkaline agents. The developers can comprise ionic, non-ionic and amphoteric surfactants (up to 3% on the total composition weight); biocides (antimicrobial and/or antifungal agents), antifoaming agents or chelating agents (such as alkali gluconates), and thickening agents (water soluble or water dispersible polyhydroxy compounds such as glycerine or polyethylene glycol).

Preferably, the processing liquid is a gum solution whereby during the development step the non-exposed areas of the photopolymerisable layer are removed from the support and the plate is gummed in a single step. The development with a gum solution has the additional benefit that, due to the remaining gum on the plate in the non-exposed areas, an additional gumming step is not required to protect the surface of the support in the non-printing areas. As a result, the precursor is processed and gummed in one single step (also referred to as development/gumming) which involves a less complex developing apparatus than a developing apparatus comprising a developer tank, a rinsing section and a gumming section. The gumming section may comprise at least one gumming unit or may comprise two, preferably three, or more gumming units. These gumming units may have the configuration of a cascade system, i.e. the gum solution, used in the second gumming unit overflows into the first gumming unit when gum replenishing solution is added in the second gumming unit or when the gum solution in the second gumming unit is used once-only, i.e. only starting gum solution is used to develop the precursor in this second gumming unit by preferably a spraying or jetting technique. The gumming section more preferably comprises three gumming units provided in a cascade configuration; i.e. the third gum solution overflows in the second gum solution, the second gum solution overflows in the first gum solution whereby the third gum solution is regenerated with fresh gum and/or regeneration solution. More details concerning such gum development is described in EP 1 788 444.

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such surface protective compounds are film-forming hydrophilic polymers or surfactants. The layer that remains on the plate after treatment with the gum solution preferably comprises between 0.005 and 20 g/m$^2$ of the surface protective compound, more preferably between 0.010 and 10 g/m$^2$, most preferably between 0.020 and 5 g/m$^2$. More details concerning the surface protective compounds in the gum solution can be found in WO 2007/057348 page 9 line 3 to page 11 line 6. As the developed plate precursor is developed and gummed in one step, there is no need to post-treat the processed plate.

The gum solution preferably has a pH value between 3 and 11, more preferably between 4 and 10, even more preferably between 5 and 9, and most preferably between 6 and 8. A suitable gum solution is described in for example EP 1 342 568 in [0008] to [0022] and WO 2005/111727. The gum solution may further comprise an inorganic salt, an anionic surfactant, a wetting agent, a chelate compound, an antiseptic compound, an antifoaming compound and/or an ink receptivity agent and/or combinations thereof. More details about these additional ingredients are described in WO 2007/057348 page 11 line 22 to page 14 line 19.

Processing of the crosslinkable coating is described in detail in unpublished patent application EP16201734 [0038] to and is incorporated herein by reference.

Drying Step

After the processing step the plate is preferably dried in a drying unit. In a preferred embodiment the plate is dried by heating the plate in the drying unit which may contain at least one heating element selected from an IR-lamp, a heated metal roller or a hot air system (heated air), preferably heated air.

In the drying step, volatile ingredients and/or liquids (e.g. solvents and/or water) are, at least for the most part, removed from the coating. The plate is preferably dried at a temperature equal to or above 25° C. Preferably between 30° C. and 100° C., more preferably between 35° C. and 80° C., and most preferably between 40° C. and 60° C. A longer heating time is usually used when a lower heating temperature is used, and a shorter heating time is used when a higher heating temperature is used. The drying time is typically between 3 seconds and 10 minutes, more preferably between 3 seconds and 5 minutes and most preferably between 2 seconds and 2 minutes. The plate is preferably dried with heated air in the drying section of a processing apparatus, or in a separate device, but most preferably in the apparatus as described below.

In the embodiment where the plate is processed on the printing press (see above), after the on-press processing and before subjection to UV LED radiation (on press), the plate is preferably heated on press by means of at least one heating element such as for example an IR lamp or a hot air system.

UV LED Radiation Step

According to the method of the present invention, after the drying step—or heating step in the embodiments of on-press processing-, the lithographic printing plate is subjected to a UV LED radiation step. The printing plate is exposed to ultraviolet light emitted by a diode (UV LED). Preferably at least one UV LED is used, more preferably at least two UV LED's are used and most preferably more than three UV LED's are used. The UV LED's are preferably ranged in a row and are then referred to as a UV LED strip or UV LED bar. Preferably at least one UV LED bar is used, more preferably at least two UV LED bars are used and most preferably at least three UV LED bars are used.

The ultraviolet light emitting diode (UV LED) emits light in the UV-A spectrum. The UV-A spectrum refers to light having a wavelength between about 315 nm to 450 nm. Preferably the UV LED emits light between about 320 nm to 420 nm and most preferably between 330 and 400 nm or between 340 and 380 nm. UV LED's with a power per LED of preferably $10^{-6}$ to 15 Watt, more preferably of $10^{-4}$ to 10 Watt, and most preferably of $10^{-2}$ to 5 Watt are used. The exposure time to the UV LED lights is preferably between 0.1 s and 5 minutes, more preferably between 0.5 s and 1 minute and most preferably between 1 s and 30 s.

In a preferred embodiment the time period between the drying step and the UV LED radiation is less than 15 minutes, more preferably between 0.01 s and 10 minutes, more preferably between 0.1 s and 5 minutes and most preferably between 0.5 s and 2 minutes. In a highly preferred embodiment, the UV LED radiation step is carried out immediately after the drying step. Alternatively, the UV LED radiation may be carried out, preferably in combination with a heating step, before mounting the printing plate—which may have been stored and/or stacked in attendance of use—on the printing press to start the printing job.

Post Treatment Devices

The present invention also provides apparatuses or devices which are especially designed for exposing the processed printing plate to UV LED radiation, as included in the method of the present invention. As explained above, this post treatment step is preferably conducted on a plate still having an elevated temperature due to the drying step and/or heating step. Therefore, the UV LED radiation may be done by means of a separate (stand-alone) apparatus including besides one or more LED bars, a heating element such as for example (not limited to) an IR-lamp, a heated metal roller or a hot air system (heated air); or by means of a device including one or more LED bars adapted to be included in a separate drying device and/or on the printing press; and/or in the drying section of a processing apparatus. The UV LED radiation is preferably included in the drying section of a processing apparatus.

Preferred Processing Apparatus

UV LED's allow a compact design and may easily be built in in the drying section of a processing unit. The distance between the heating element(s) in the drying section and the UV LED used is preferably not more than 15 cm, more preferably not more than 10 cm and most preferably not more than 5 cm.

FIG. 1 shows a preferred processing apparatus according to the present invention where a UV LED bar is included in the drying section of a processing apparatus. FIG. 1 represents a highly preferred embodiment of such a processing apparatus, which includes a development/gumming section (1) comprising three gumming units (3, 4 and 5) mutually connected by a cascade which allows overflow of liquid from the third gumming unit into the second gumming unit (14B) and from the second gumming unit into the first gumming unit (14A).

Additional gumming units may be used, but the preferred embodiments comprise two gumming units in the development/gumming section which are mutually connected by a cascade which allows overflow of liquid from the second gumming unit into the first gumming unit, or three gumming units. Well-known features which are preferably present in the processing apparatus but not shown in FIG. 1 are: a feeder for delivering plates one by one to the development/gumming section; a (re)circulation and/or regeneration system; supply comprising fresh gum solution, or one or more replenishing solutions; waste collector tanks wherein exhausted gum solution are drained; a water tank to dilute concentrated chemistry; and other conventional parts.

Gum solutions 1 and 2 are applied to the printing plate by a spraying, jetting, dipping or coating technique, including spin coating, roll coating, slot coating or gravure coating. The use of spray or (valve) jet nozzles is preferred. All features of the nozzles as described in WO 2017/157571 [0093] to [0100] for supplying gum solution possibly in accordance with the plate area or even with the image data of the plate as described in EP 2 775 351, apply here.

Two spray bars are provided in the first gumming unit: one bar (8A) which is capable of spraying gum both onto the nip of the roller pair (6A) and onto the brush (9A), one bar (8B) which sprays gum towards the nip of the roller pair (6B). In the second gumming unit, one bar (8C) capable of spraying gum both onto the nip of the roller pair (6C) and onto the brush (9B) and one bar (8D) for spraying gum towards the nip of the roller pair (6D) are provided.

In the preferred embodiment of FIG. 1, the nip rollers (6A) are provided with a scavenger roller (7A) to prevent contamination of gum outside the development/gumming section. In the third gumming unit, the scavenger roller 7C provides, in combination with the gum application nozzle (20), a finishing (gum) layer onto the surface of the plate.

The bars spraying gum to the nip of the roller pair preferably contain at least one row of holes; the bars (8A and 8C) capable of spraying gum both onto the roller and brushes (9A or 9B) preferably contain at least two rows of holes. Preferably, the bar(s) for spraying the first gum solution, more preferably bars (8A) and (8B) are in a so-called jog-mode, i.e. gum is provided on a regular basis even when no plate is present in the gumming unit in order to prevent stickiness of the nip rollers and/or brush. Preferably, the nip rollers are engaged on a regular basis; even when no plate passes. The second gumming unit further includes spray bars (8C and 8D) which are capable of keeping both nip rollers in the second unit (6C and 6D) wet. These spray bars may also be in the jog-mode.

The third gum solution is preferably regenerated by means of an inlet (16) that supplies regenerator liquid, which may be water, optionally diluted fresh gum and/or replenishment solution, to the third gumming unit, e.g. to the sump (10C). Other well-known elements of the regenerator system are not shown in the FIG. 1, such as a supply tank for holding fresh gum solution, water or replenishment solution; a pump and the necessary pipes to supply the regenerator liquid to the third gumming unit. Also the first and/or the second gum solution may be regenerated, either by the same or an analogous regeneration system as used for the third gum solution. The first and/or second gum solution may also be regenerated by actively pumping gum solution from the third gumming unit to the second gumming unit and/or from the second gumming unit to the first gumming unit.

After the final gum has been applied, the plate is preferably not rinsed but immediately conveyed to the drying section (2) which is integrated into the apparatus. Drying can be achieved by heating element (17) by emitting hot air, infrared and/or microwave radiation, and other methods generally known in the art. At least one UV LED bar (18) is included in the drying section.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

EXAMPLES

All materials used in the following examples were readily available from standard sources such as Sigma-Aldrich (Belgium) and Acros (Belgium) unless otherwise specified.

Preparation of the Aluminium Support S-01

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/dm2. Afterwards, the aluminium foil was then desmutted by etching with an aqueous solution containing 5.5 g/l of NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 A/dm2, then washed with demineralised water for 11 seconds and dried at 120° C. for 5 seconds. The support S-01 thus obtained was characterised by a surface roughness Ra of 0.35-0.4 μm (measured with interferometer NT1100) and had an anodic weight of 3.0 g/m².

Preparation of the Printing Plate Precursors PP-01 to PP-09

The photopolymerisable layer was produced by coating onto the above described support S-01 a coating solution including the components as defined in Table 1 (see below) dissolved in a mixture of MEK and Dowanol PM (1-methoxy-2-propanol, commercially available from DOW CHEMICAL Company). This coating solution was applied at a wet coating thickness of 30 μm and then dried at 120° C. for 1 minute in a circulation oven.

TABLE 1

| dry coating weight of the photopolymerisable layer | |
|---|---|
| Ingredients | PL-1 mg/m² |
| Tegoglide 410 (1) | 1.5 |
| Ruco coat EC4811 (2) | 150 |
| Mono Z1620 (3) | 292 |
| FST510 (4) | 112 |
| Sartomer CN104 (5) | 292 |
| HABI 1-2 (6) | 90 |
| Fluomix (7) | 60 |
| MBT (8) | 21 |

TABLE 1-continued

| | dry coating weight of the photopolymerisable layer |
|---|---|
| Ingredients | PL-1 mg/m² |
| PB60 (9) | 45 |
| Aerosil 150 (9) | 50 |
| Bykjet 9152 (9) | 48 |
| Albritect CP30 (10) | 30 |
| Sipomer PAM 100 (11) | 170 |

(1) Tegoglide 410 ™ is a surfactant commercially available from Evonik Tego Chemie GmbH;

(2) Ruco Coat EC4811 is an aliphatic polyether polyurethane commercially available as a 30 wt. % aqueous dispersion from Rudolf GmbH;

(3) Mono Z1620, monomer, commercially available from Clariant;

(4) FST510 is a di-urethanedimethacrylate commercially available from AZ Electronic;

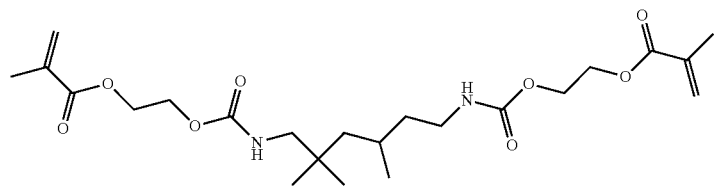 [SMILES: C=C(C)C(=O)OCCOC(=O)NCCC(C)CC(C)(C)CNC(=O)OCCOC(=O)C(=C)C]

(5) Sartomer CN104 is tris (2-hydroxy ethyl) isocyanurate triacrylate commercially available from Sartomer/Arkema;

(6) HABI-1, comparative photoinitiator, commercially available from Hodogaya Chemical;

(7) Fluomix is a violet sensitizer mixture consisting of the following compounds:

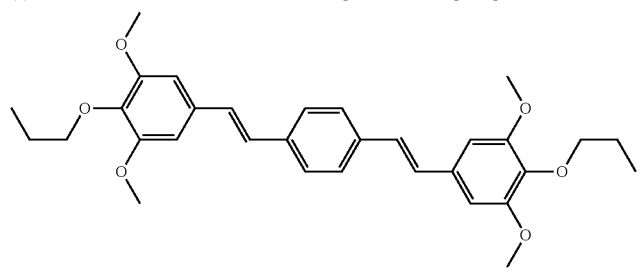

15 wt. %

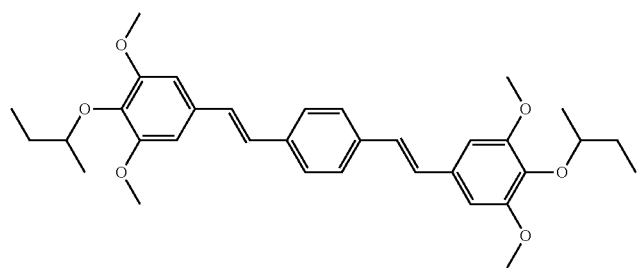

38 wt. %

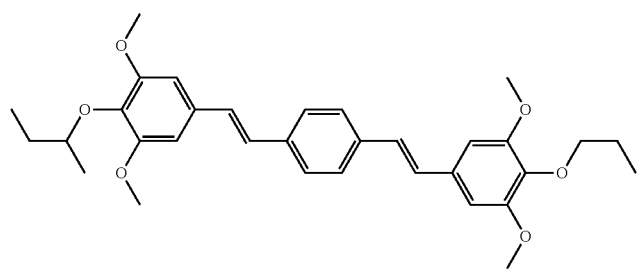

47 wt. %

(8) MBT is 2-mercaptobenzthiazole;

(9) PB60 is a blue pigment commercially available from Dominion Colour Corporation; Aerosil 150 is a silica particle with a surface area (BET) of 135-165 m2/g commercially available from DEGUSSA; Bykjet 9152 dispersion agent, commercially available from BYK (Altana Group);

(10) Albritect CP30 is a poly(acrylic acid) poly(vinylphosphonic acid) 70/30 copolymer from RHODIA;

(11) Sipomer PAM100 is a phosphate ester of polyethylene glycol monomethacrylate from RHODIA.

On top of the photopolymerisable layer an aqueous solution with the composition as defined in Table 2 was coated (40 μm wet thickness) and dried at 120° C. for 2 minutes.

TABLE 2 dry coating weight of the top layer

| Ingredients | mg/m² |
| --- | --- |
| Mowiol 4/88 (1) | 817 |
| Mowiol 4/98 (2) | 493 |
| Ebotec MB-SF (3) | 2 |
| Lutensol A8 (4) | 14 |
| Advantage S (5) | 27 |

1) Mowiol 4-88 is a partially hydrolyzed polyvinylalcohol commercially available from Kuraray;
2) Mowiol 4-98 is a fully hydrolyzed polyvinylalcohol commercially available from Kuraray
3) Ebotec MB-SF is a biocide commercially available from BODE CHEMIE HAMBURG GmbH;
4) Lutensol A8 is a surface active agent commercially available from BASF;
5) Advantage S is a dewetting agent commercially available from ISP.

Imaging

Exposure was carried out on an Advantage DL3850 violet plate-setter, available from Agfa NV. The printing plate precursors were exposed through an UGRA step wedge (wedge constant=0.15). A sample of each printing plate precursor was exposed in order to determine its sensitivity. This is the energy density (μJ/cm²) required to obtain a density of at least 97% of Dmax (Dmax is the maximum solid density that can be obtained and is measured with a Gretag Macbeth densitometer Type D19C device) after preheat and processing on step 3 of the reproduction of the UGRA step wedge on the printing plate.

Processing

After imaging, the plate precursors were developed in an Attiro cleanout unit, commercially available from Agfa NV with Attiro gum, commercially available from Agfa NV, at 24° C. and a speed of 3 m/min. The preheat section of this clean-out unit was disconnected and not used.

Drying and Post Treatment

The drying unit includes a drying section including a heating element in the form of hot air and a UV LED radiation section including a low power UV LED strip. Table 3 below summarizes the specifications of the UV LED strip. The dryer was set at different temperatures (between room temperature and 70° C.). Printing plates PP-01 to PP-09 were obtained by performing the drying and/or post treatment following the conditions as indicated in Table 4 below.

TABLE 3

Specifications of the UV LED radiation section

| | |
| --- | --- |
| Distance of the dryer to the exit NIP roller | 7 cm |
| Distance of the plate to the LED strip* | 2.3 cm |
| Speed of the precursor | 3 m/min |
| Power output of the LED strip | 215 μW/cm² (0.215 mW/cm²) |
| Energy output of the LED strip | 301 μJ/cm² (0.301 mJ/cm²) |

**LED strip commercially available from LuxaLight BV; 24 V UV 365 nm Protected 3528 (24 Volt, 240 LEDs, 3528, IP64)
*LED output was measured with a AGFA UV device (IL1400 ™) SEL033 (CR97 MUG2 #R3) #275

Press Life of the Printing Plates PP-01 to PP-09

The dried and/or UV LED treated printing plates PP-01 to PP-09 (see Table 4) were cut to the correct size to allow them to be mounted side-by-side on a Gazelle Drent Webpres; commercially available from DG Press. The printing was performed on Newspress 45 g/m² paper (commercially available from Stora Enso langerbrugge) using "Eurostat Black OR M" ink (commercially available from Flint Group) and a fountain solution containing 2.5% Prima FS404AS (commercially available from Agfa NV) and 5% Isopropyl alcohol.

When during printing, the image parts of a printing plate wear, the print quality reduces (i.e. for example image damage) which is visible on the printed sheets. The press life of each printing plate was evaluated by visually monitoring the occurrence of the image damage on the printed sheets. The press life of PP-05 was defined as 100% and the remaining printing plates were ranked relative to this value.

TABLE 4

Press life results of PP-01 to PP-09

| Printing plate | LED | Wave length of the LED | Position of the LED strip | Dryer Setting Temperature (° c.) | Press life* |
| --- | --- | --- | --- | --- | --- |
| PP-01 Inventive | Y | 375 | drying section | — | 60% |
| PP-02 Inventive | Y | 375 | after the exit rollers** | 60 | 70% |
| PP-03 Inventive | Y | 375 | drying section | 40 | 70% |
| PP-04 Inventive | Y | 375 | drying section | 60 | 95% |
| PP-05 Inventive | Y | 375 | drying section | 70 | 100% |
| PP-06 Inventive | Y | 365 | drying section | 60 | 95% |
| PP-07 Inventive | Y | 395 | drying section | 60 | 95% |
| PP-08 Comparative | N | — | — | 30 | 50% |
| PP-09 Comparative | N | — | — | 60 | 60% |

*see above
**exit rollers which guide the plate out of the drying unit.

The results summarized in Table 4 illustrate the following:

Inventive printing plate PP-01 and Comparative printing plate PP-08 show that by applying a UV LED radiation after drying of the printing plate significantly improves the press life;

Inventive printing plates PP-01, PP-03, PP-04 and PP-05 show that the press life of a UV LED treated plate can be further improved by enhancing the temperature in the drying step; at a temperature of 60° C. a very good press life is obtained and at 70° C. this press life is even further improved;

Inventive printing plates PP-02 and PP-04 show that the position of the UV LED strip influences the press life: although the temperature setting in the drying section is the same, the temperature at which the LED radiation is performed is lower for inventive PP-02 as (i) the UV LED radiation is positioned further away relative to the heating element in the drying section, and/or (ii) the exit rollers may cool down the plate as it passes through.

Comparative printing plates PP-08 and PP-09 show that the press life of a plate, which was not preheated and which was not post treated with UV LED radiation, cannot be enhanced with a higher drying temperature.

The invention claimed is:

1. A method for making a negative-working lithographic printing plate, the method comprising in sequential order:
   image-wise exposing a lithographic printing plate precursor including a hydrophilic support and a coating provided on the hydrophilic support, the coating including a crosslinkable composition and/or a photopolymerizable composition;
   developing the lithographic printing plate precursor;
   drying and/or heating the lithographic printing plate precursor to obtain a lithographic printing plate; and
   subjecting the lithographic printing plate to UV LED radiation,
   wherein the lithographic printing plate is subjected to the UV LED radiation for a time period between 0.1 s and 5 minutes.

2. The method according to claim 1, wherein the coating includes a radical polymerization initiator, a radically polymerizable compound, and a binder polymer.

3. The method according to claim 1, wherein the coating includes a diazonium compound.

4. The method according to claim 1, wherein the subjecting the lithographic printing plate to UV LED radiation is performed with at least one UV LED having a power $10^{-6}$ to 15 Watt.

5. The method according to claim 1, wherein the UV LED radiation includes light having a wavelength from 315 nm to 450 nm.

6. The method according to claim 1, wherein the image-wise exposing the lithographic printing plate precursor is performed with light having a wavelength range between 200 nm and 450 nm.

7. The method according to claim 1, wherein the lithographic printing plate is not subjected to a preheat step between the image-wise exposing and the developing.

8. The method according to claim 1, wherein the developing of the lithographic printing plate precursor is performed with a gum solution.

9. The method according to claim 8, wherein the lithographic printing plate precursor is developed in a gumming station including a first gumming unit and a second gumming unit; and
   the developing of the lithographic printing plate precursor includes consecutively developing the lithographic printing plate precursor in the first gumming unit and the second gumming unit with a gum solution to remove non-exposed areas of the coating from the hydrophilic support and gumming the lithographic printing plate in a single step.

10. The method according to claim 9, wherein the first gumming unit and the second gumming unit together define a cascade system such that the gum solution used in the second gumming unit overflows into the first gumming unit.

11. The method according to claim 2, wherein the developing of the lithographic printing plate precursor is performed with a gum solution.

12. The method according to claim 11, wherein the lithographic printing plate precursor is developed in a gumming station including a first gumming unit and a second gumming unit; and
   the developing of the lithographic printing plate precursor includes consecutively developing the lithographic printing plate precursor in the first gumming unit and the second gumming unit with a gum solution to remove non-exposed areas of the coating from the hydrophilic support and gumming the lithographic printing plate in a single step.

13. The method according to claim 12, wherein the first gumming unit and the second gumming unit together define a cascade system such that the gum solution used in the second gumming unit overflows into the first gumming unit.

14. The method according to claim 3, wherein the developing of the lithographic printing plate precursor is performed with a gum solution.

15. The method according to claim 14, wherein the lithographic printing plate precursor is developed in a gumming station including a first gumming unit and a second gumming unit; and
   the developing of the lithographic printing plate precursor includes consecutively developing the lithographic printing plate precursor in the first gumming unit and the second gumming unit with a gum solution to remove non-exposed areas of the coating from the hydrophilic support and gumming the lithographic printing plate in a single step.

16. The method according to claim 15, wherein the first gumming unit and the second gumming unit together define a cascade system such that the gum solution used in the second gumming unit overflows into the first gumming unit.

17. The method according to claim 1, wherein the developing of the lithographic printing plate precursor includes:
   mounting the lithographic printing plate precursor on a plate cylinder of a lithographic printing press and rotating the plate cylinder while feeding dampening liquid and/or ink to the lithographic printing plate precursor.

18. An apparatus for processing a lithographic printing plate, the apparatus comprising:
   a development/gumming section; and
   a drying section; wherein
   the drying section includes a drying means and at least one UV LED radiation bar, and the development/gumming section includes a first gumming unit and a second gumming unit mutually connected by a cascade to allow overflow of liquid from the second gumming unit into the first gumming unit.

* * * * *